(12) United States Patent
Nago et al.

(10) Patent No.: US 9,196,786 B2
(45) Date of Patent: Nov. 24, 2015

(54) SEMICONDUCTOR LIGHT EMITTING ELEMENT AND METHOD FOR MANUFACTURING THE SAME

(71) Applicant: Kabushiki Kaisha Toshiba, Minato-ku (JP)

(72) Inventors: Hajime Nago, Kanagawa-ken (JP); Shigeya Kimura, Kanagawa-ken (JP); Yoshiyuki Harada, Ishikawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 4 days.

(21) Appl. No.: 14/104,105

(22) Filed: Dec. 12, 2013

(65) Prior Publication Data

US 2014/0183447 A1 Jul. 3, 2014

(30) Foreign Application Priority Data

Dec. 28, 2012 (JP) ................................. 2012-287340

(51) Int. Cl.
*H01L 33/06* (2010.01)
*H01L 33/32* (2010.01)
(Continued)

(52) U.S. Cl.
CPC ................. *H01L 33/06* (2013.01); *B82Y 20/00* (2013.01); *H01L 33/325* (2013.01);
(Continued)

(58) Field of Classification Search
CPC ................................ H01L 33/32; H01L 33/06
USPC .............................................. 257/13; 438/47
See application file for complete search history.

(56) References Cited

U.S. PATENT DOCUMENTS 8,148,713 B2 * 4/2012 Sato et al. ........................ 257/13
8,183,555 B2 * 5/2012 Kim ................................. 257/13
(Continued)

FOREIGN PATENT DOCUMENTS

CN 1669158 A 9/2005
EP 1 553 670 A2 7/2005
(Continued)

OTHER PUBLICATIONS

Extended European Search Report issued Aug. 5, 2014, in European Patent Application No. 13198246.4.
(Continued)

*Primary Examiner* — Jami M Valentine
(74) *Attorney, Agent, or Firm* — Oblon, McClelland, Maier & Neustadt, L.L.P.

(57) ABSTRACT

According to one embodiment, a semiconductor light emitting element includes an n-type semiconductor layer including a nitride semiconductor, a p-type semiconductor layer and a light emitting layer. The p-type semiconductor layer includes a first p-side layer of $Al_{x1}Ga_{1-x1}N$ ($0 \leq x1 < 1$) including Mg, a second p-side layer of $Al_{x2}Ga_{1-x2}N$ ($0 < x2 < 1$) including Mg and a third p-side layer of $Al_{x3}Ga_{1-x3}N$ ($x2 < x3 < 1$) including Mg. The light emitting layer is provided between the n-type semiconductor layer and the second p-side layer. The light emitting layer includes barrier layers and well layers. Each of the well layers is provided between the barrier layers. A p-side barrier layer of the barrier layers most proximal to the second p-side layer includes a first layer of $Al_{z1}Ga_{1-z1}N$ ($0 \leq z1$), and a second layer of $Al_{z2}Ga_{1-z2}N$ ($z1 < z2 < x2$).

19 Claims, 5 Drawing Sheets

(51) Int. Cl.
*H01S 5/343* (2006.01)
*B82Y 20/00* (2011.01)
*H01L 33/02* (2010.01)
*H01S 5/32* (2006.01)
*H01S 5/34* (2006.01)
*H01L 33/00* (2010.01)
*H01L 33/14* (2010.01)

(52) U.S. Cl.
CPC ........ *H01S 5/34333* (2013.01); *H01S 5/34346* (2013.01); *H01L 33/007* (2013.01); *H01L 33/025* (2013.01); *H01L 33/14* (2013.01); *H01S 5/3211* (2013.01); *H01S 5/3407* (2013.01)

(56) References Cited

U.S. PATENT DOCUMENTS

| | | | |
|---|---|---|---|
| 8,436,334 B2* | 5/2013 | Soh et al. | 257/13 |
| 2004/0004223 A1* | 1/2004 | Nagahama et al. | 257/74 |
| 2005/0152420 A1 | 7/2005 | Kim | |
| 2007/0090339 A1 | 4/2007 | Lee et al. | |
| 2007/0290230 A1 | 12/2007 | Kawaguchi et al. | |
| 2008/0247435 A1 | 10/2008 | Choi | |
| 2011/0006282 A1 | 1/2011 | Hatori et al. | |
| 2011/0182312 A1 | 7/2011 | Chen et al. | |
| 2011/0198583 A1* | 8/2011 | Nago et al. | 257/43 |
| 2011/0272670 A1 | 11/2011 | Kawaguchi et al. | |
| 2012/0049157 A1 | 3/2012 | Nago et al. | |
| 2012/0145993 A1 | 6/2012 | Na et al. | |
| 2013/0001512 A1 | 1/2013 | Kotani | |
| 2013/0223463 A1 | 8/2013 | Kawaguchi et al. | |

FOREIGN PATENT DOCUMENTS

| | | |
|---|---|---|
| EP | 1 553 670 A3 | 7/2005 |
| EP | 1 670 106 A1 | 6/2006 |
| EP | 2 549 599 A1 | 1/2013 |
| JP | 2000-261106 | 9/2000 |
| JP | 2005-203520 A | 7/2005 |
| JP | 4892618 B2 | 12/2011 |
| JP | 5060656 B2 | 8/2012 |
| KR | 10-2012-0110831 | 10/2012 |
| TW | 201130157 A1 | 9/2011 |

OTHER PUBLICATIONS

Joachim Piprek, et al., "Carrier nonuniformity effects on the internal efficiency of multiquantum-well lasers", Applied Physics Letters, vol. 74, No. 4, XP-002724000, Jan. 25, 1999, pp. 489-491.

Office Action issued Jan. 20, 2015 in Korean Patent Application No. 10-2013-0159990 (with English translation).

Combined Taiwanese Office Action and Search Report issued Apr. 10, 2015 in Patent Application No. 102145579 (with English language translation).

Office Action mailed Jun. 26, 2015 in Korean Application No. 10-2013-159990 (w/English translation).

* cited by examiner

SEMICONDUCTOR LIGHT EMITTING ELEMENT AND METHOD FOR MANUFACTURING THE SAME

CROSS-REFERENCE TO RELATED APPLICATIONS

This application is based upon and claims the benefit of priority from Japanese Patent Application No. 2012-287340, filed on Dec. 28, 2012; the entire contents of which are incorporated herein by reference.

FIELD

Embodiments described herein relate generally to a semiconductor light emitting element and a method for manufacturing the same.

BACKGROUND

Semiconductor light emitting elements such as light emitting diodes, laser diodes, etc., that use nitride semiconductors are being developed. It is desirable to increase the luminous efficiency of such semiconductor light emitting elements.

DETAILED DESCRIPTION

Figure 1:
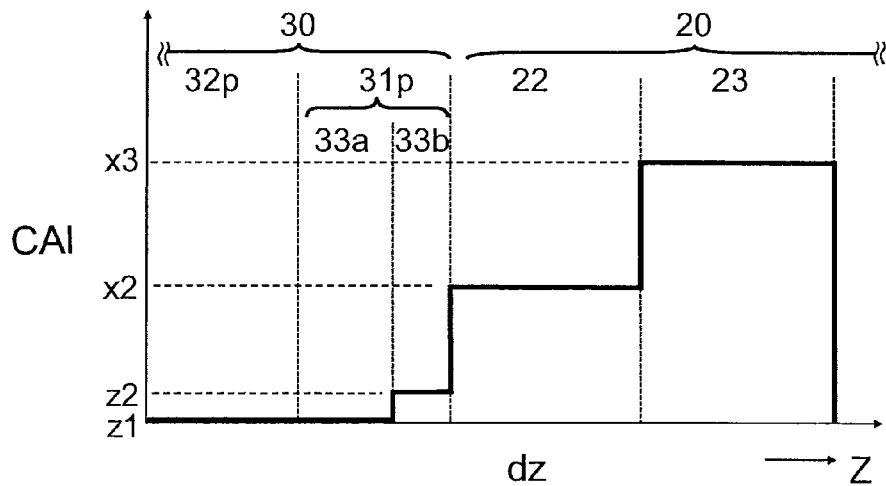
FIG. 1 is a schematic view illustrating a semiconductor light emitting element according to a first embodiment.

According to one embodiment, a semiconductor light emitting element includes an n-type semiconductor layer including a nitride semiconductor, a p-type semiconductor layer and a light emitting layer. The p-type semiconductor layer includes a first p-side layer of $Al_{x1}Ga_{1-x1}N$ ($0 \le x1 < 1$) including Mg, a second p-side layer of $Al_{x2}Ga_{1-x2}N$ ($0 < x2 < 1$) including Mg and a third p-side layer of $Al_{x3}Ga_{1-x3}N$ ($x2 < x3 < 1$) including Mg. The second p-side layer is provided between the first p-side layer and the n-type semiconductor layer. The third p-side layer is provided between the first p-side layer and the second p-side layer. The light emitting layer is provided between the n-type semiconductor layer and the second p-side layer. The light emitting layer includes a plurality of barrier layers and a plurality of well layers. Each of the well layers is provided between the barrier layers. A p-side barrier layer of the barrier layers most proximal to the second p-side layer includes a first layer of $Al_{z1}Ga_{1-z1}N$ ($0 \le z1$), and a second layer of $Al_{z2}Ga_{1-z2}N$ ($z1 < z2 < x2$). The second layer is provided between the first layer and the second p-side layer. The second layer contacts the first layer and the second p-side layer. A thickness of the p-side barrier layer is less than 3.5 nanometers.

According to one embodiment, a method is disclosed for manufacturing a semiconductor light emitting element. The element includes an n-type semiconductor layer, a p-type semiconductor layer, and a light emitting layer provided between the n-type semiconductor layer and the second p-side layer, the n-type semiconductor layer including a nitride semiconductor, the p-type semiconductor layer including a first p-side layer of $Al_{x1}Ga_{1-x1}N$ ($0 \le x1 < 1$) including Mg, a second p-side layer of $Al_{x2}Ga_{1-x2}N$ ($0 < x2 < 1$) including Mg provided between the first p-side layer and the n-type semiconductor layer, and a third p-side layer of $Al_{x3}Ga_{1-x3}N$ ($x2 < x3 < 1$) including Mg provided between the first p-side layer and the second p-side layer, the light emitting layer including a plurality of barrier layers and a plurality of well layers provided respectively between the plurality of barrier layers. The method can include forming the light emitting layer on the n-type semiconductor layer and forming the p-type semiconductor layer on the light emitting layer. The forming of the light emitting layer includes making a p-side barrier layer of the plurality of barrier layers most proximal to the second p-side layer to include a first layer of $Al_{z1}Ga_{1-z1}N$ ($0 \le z1$) and a second layer of $Al_{z2}Ga_{1-z2}N$ ($z1 < z2 < x2$), the first layer being provided between the n-type semiconductor layer and the second p-side layer, the second layer being provided between the first layer and the second p-side layer to contact the first layer and the second p-side layer, a thickness of the p-side barrier layer being less than 3.5 nanometers.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic view illustrating a semiconductor light emitting element according to a first embodiment.

Figure 2:
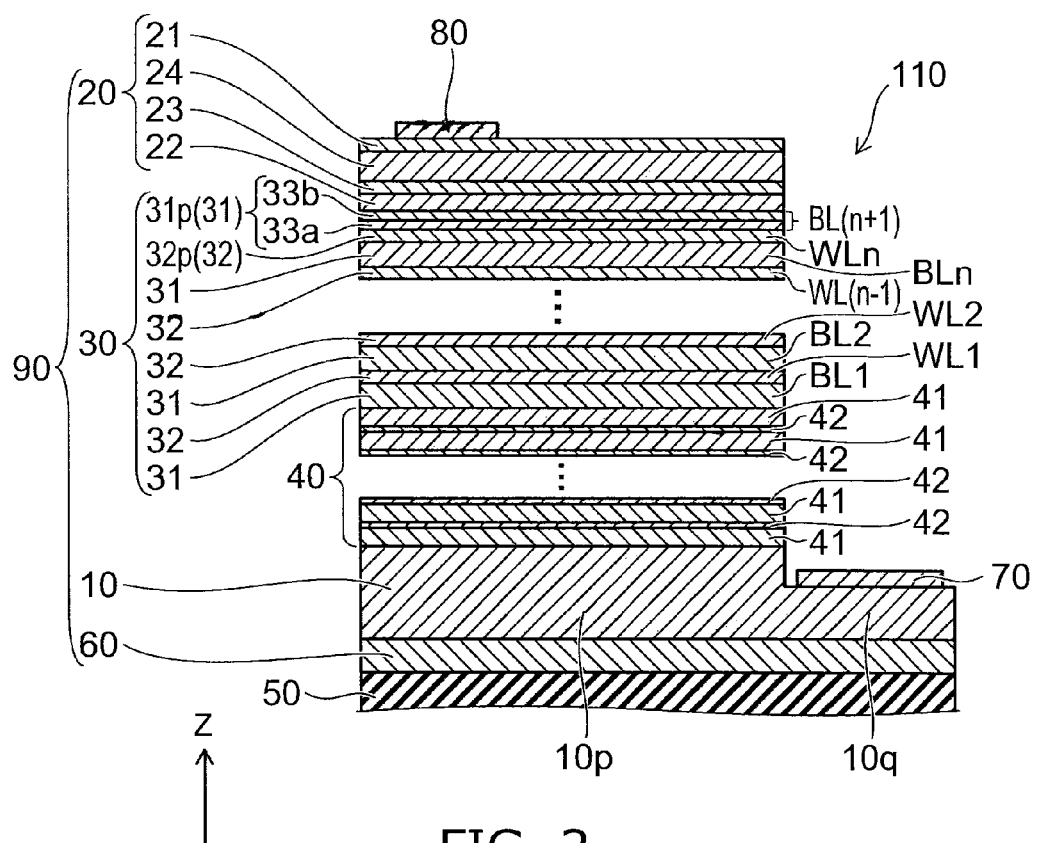
FIG. 2 is a schematic cross-sectional view illustrating the semiconductor light emitting element according to the first embodiment.

FIG. 2 is a schematic cross-sectional view illustrating the semiconductor light emitting element according to the first embodiment.

First, an overview of the configuration of the semiconductor light emitting element will be described with reference to FIG. 2.

As shown in FIG. 2, the semiconductor light emitting element 110 according to the embodiment includes an n-type semiconductor layer 10, a p-type semiconductor layer 20, and a light emitting layer 30. The light emitting layer 30 is provided between the n-type semiconductor layer 10 and the p-type semiconductor layer 20.

The n-type semiconductor layer 10 includes a nitride semiconductor.

The n-type semiconductor layer 10 includes, for example, an n-type GaN layer doped with silicon (Si). The n-type semiconductor layer 10 includes an n-type contact layer. The Si concentration of the n-type contact layer is, for example, not less than $1 \times 10^{18}$ (atoms/cm$^3$) and not more than $1 \times 10^{19}$ (atoms/cm$^3$), e.g., about 8×10$^{18}$ (atoms/cm$^3$). The thickness of the n-type semiconductor layer 10 is, for example, not less than 2 micrometers (μm) and not more than 8 μm, e.g., 5 μm. At least a portion of the n-type semiconductor layer 10 functions as, for example, an n-type clad layer.

A direction from the n-type semiconductor layer 10 toward the p-type semiconductor layer 20 is taken as a Z-axis direction. The Z-axis direction is parallel to the stacking direction of a stacked structural body 90 including the n-type semiconductor layer 10, the light emitting layer 30, and the p-type semiconductor layer 20.

In the specification, the state of being stacked includes not only the state of overlapping in contact with each other but also the state of overlapping with another layer inserted therebetween.

The p-type semiconductor layer 20 includes a first p-side layer 21, a second p-side layer 22, and a third p-side layer 23. The second p-side layer 22 is disposed between the first p-side layer 21 and the n-type semiconductor layer 10. The third p-side layer 23 is disposed between the first p-side layer 21 and the second p-side layer 22. In the example, a fourth p-side layer 24 is further provided. The fourth p-side layer 24 is disposed between the first p-side layer 21 and the third p-side layer 23.

The first p-side layer 21 includes Mg. The first p-side layer 21 includes, for example, $Al_{x1}Ga_{1-x1}N$ (0≤x1<1). The Al composition ratio x1 of the first p-side layer 21 is, for example, less than 0.01 and not less than 0. The first p-side layer 21 includes, for example, a p-type GaN layer. The first p-side layer 21 is, for example, a p-side contact layer. The Mg concentration of the first p-side layer 21 is, for example, not less than 1×10$^{20}$ cm$^{-3}$ and not more than 3×10$^{21}$ cm$^{-3}$. The thickness of the first p-side layer 21 is, for example, not less than 5 nanometers (nm) and not more than 20 nm, e.g., about 10 nm.

The second p-side layer 22 includes Mg. For example, an $Al_{x2}Ga_{1-x2}N$ (0<x2<1) layer is used as the second p-side layer 22.

The third p-side layer 23 includes Mg. For example, an $Al_{x3}Ga_{1-x3}N$ (x2<x3<1) layer is used as the third p-side layer 23.

Examples of the second p-side layer 22 and the third p-side layer 23 are described below.

The fourth p-side layer 24 includes Mg. For example, $Al_{x4}Ga_{1-x4}N$ (0≤x4<1) is used as the fourth p-side layer 24. The Al composition ratio x4 of the fourth p-side layer 24 is lower than the Al composition ratio x3. For example, the Al composition ratio x4 is lower than the Al composition ratio x2. The Al composition ratio x4 is, for example, less than 0.1 and not less than 0. For example, a p-type GaN layer is used as the fourth p-side layer 24. The fourth p-side layer 24 functions as, for example, a p-side clad layer. The Mg concentration of the fourth p-side layer 24 is lower than the Mg concentration of the first p-side layer 21. The Mg concentration of the fourth p-side layer 24 is, for example, not less than 1×10$^{19}$ cm$^{-3}$ and not more than 1×10$^{20}$ cm$^{-3}$. The thickness of the fourth p-side layer 24 is, for example, not less than 20 nm and not more than 150 nm, e.g., about 80 nm.

The light emitting layer 30 is disposed between the n-type semiconductor layer 10 and the second p-side layer 22 of the p-type semiconductor layer 20.

In the example, the n-type semiconductor layer 10 has a first portion 10p and a second portion 10q. The second portion 10q is arranged with the first portion 10p along a direction perpendicular to the Z-axis direction. In the example, the p-type semiconductor layer 20 opposes the first portion 10p.

The light emitting layer 30 is provided between the first portion 10p and the p-type semiconductor layer 20.

In the specification of the application, the state of being opposed includes not only the state of directly facing each other but also the state in which another component is inserted therebetween.

The light emitting layer 30 has, for example, a multiple quantum well (MQW) configuration. The light emitting layer 30 includes multiple barrier layers 31 and multiple well layers 32. The multiple well layers 32 are provided respectively between the multiple barrier layers 31. For example, the multiple barrier layers 31 and the multiple well layers 32 are stacked alternately along the Z-axis direction.

The light emitting layer 30 includes, for example, n+1 barrier layers 31 and n well layers 32 (n being an integer not less than 2). The (i+1)th barrier layer BL(i+1) is disposed between the ith barrier layer BLi and the p-type semiconductor layer 20 (i being an integer not less than 1 and not more than n−1). The (i+1)th well layer WL(i+1) is disposed between the nth well layer WLn and the p-type semiconductor layer 20. The first barrier layer BL1 is provided between the n-type semiconductor layer 10 and the first well layer WL1. The nth well layer WLn is provided between the nth barrier layer BLn and the (n+1)th barrier layer BL(n+1). The (n+1)th barrier layer BL(n+1) is provided between the nth well layer WLn and the p-type semiconductor layer 20. The number n of the well layers 32 is, for example, not less than 6 layers.

The barrier layer 31 includes, for example, $Al_{z1}In_{y1}Ga_{1-y1}N$ (0≤y1<1 and 0≤z1<1). The well layer 32 includes $In_{y2}Ga_{1-y2}N$ (0<y2≤1 and y1<y2). In other words, the well layer 32 includes In. In the case where the barrier layer 31 includes In, the In composition ratio y1 of the barrier layer 31 is lower than the In composition ratio y2 of the well layer 32. Or, the barrier layer 31 substantially does not include In. The barrier layer 31 includes, for example, a GaN layer. The bandgap energy of the barrier layer 31 is greater than the bandgap energy of the well layer 32. The In composition ratio y1 of the barrier layer 31 is, for example, not more than 0.01. The In composition ratio y2 of the well layer 32 is, for example, not less than 0.08 and not more than 0.18, e.g., not less than 0.1 and not more than 0.14.

The thickness of the well layer 32 is, for example, not less than 1.5 nm and not more than 6 nm.

As described below, the thickness of the barrier layer 31 of the multiple barrier layers 31 that is proximal to the p-type semiconductor layer 20 is thin. The thickness of the barrier layer 31 other than the barrier layer 31 proximal to the p-type semiconductor layer 20 is, for example, not less than 3.5 nm and not more than 8 nm.

The barrier layer 31 of the multiple barrier layers 31 most proximal to the p-type semiconductor layer 20 is referred to as a p-side barrier layer 31p. The p-side barrier layer 31p corresponds to the (i+1)th barrier layer BL(i+1). The well layer 32 of the multiple well layers 32 most proximal to the p-type semiconductor layer 20 is referred to as a p-side well layer 32p. The p-side well layer 32p corresponds to the nth well layer WLn. For example, the p-side barrier layer 31p corresponds to the uppermost barrier layer of the multiple barrier layers 31. For example, the p-side well layer 32p corresponds to the uppermost well layer of the multiple well layers 32.

An example of the case where the p-side barrier layer 31p substantially does not include In will now be described. In other words, in the p-side barrier layer 31p, the In composition ratio y1 recited above is substantially 0. For example, the In composition ratio y1 is not more than 0.001.

The p-side barrier layer 31p includes a first layer 33a and a second layer 33b. The first layer 33a is disposed between the p-side well layer 32p and the p-type semiconductor layer 20 (e.g., the second p-side layer 22). The second layer 33b is disposed between the first layer 33a and the p-type semiconductor layer 20 (e.g., the second p-side layer 22).

The first layer 33a includes an $Al_{z1}Ga_{1-z1}N$ ($0 \leq z1$) layer. The second layer 33b includes an $Al_{z2}Ga_{1-z2}N$ ($z1<z2<x2$) layer. The first layer 33a includes, for example, a GaN layer. The second layer 33b includes, for example, an AlGaN layer. The Al composition ratio z1 of the first layer 33a is lower than the Al composition ratio z2 of the second layer 33b. The state in which the second layer 33b does not include Al also is included in the state in which the Al composition ratio z1 is lower than the Al composition ratio z2. The Al composition ratio z2 of the second layer 33b is lower than the Al composition ratio x2 of the second p-side layer 22.

For example, the thickness of a barrier layer 31 of the multiple barrier layers 31 other than the p-side barrier layer 31p is thicker than the thickness of the p-side barrier layer 31p. For example, the thickness of the barrier layer 31 of the multiple barrier layers 31 other than the p-side barrier layer 31p is thicker than the thickness of the well layer 32. For example, the thickness of the barrier layer 31 of the multiple barrier layers 31 other than the p-side barrier layer 31p is thicker than the thickness of the well layer 32 of the multiple well layers 32 other than the p-side well layer 32p.

Conversely, there are cases where, for example, the thickness of the p-side barrier layer 31p is thinner than the thickness of the well layer 32. For example, there are cases where the thickness of the p-side barrier layer 31p is thinner than the thickness of the p-side well layer 32p.

Examples of the p-side well layer 32p and the p-side barrier layer 31p are described below.

In the example, the semiconductor light emitting element 110 further includes a substrate 50, a foundation layer 60, a first electrode 70, and a second electrode 80. The foundation layer 60 is included in the stacked structural body 90. The foundation layer 60 is provided between the substrate 50 and the n-type semiconductor layer 10.

The first electrode 70 is electrically connected to the n-type semiconductor layer 10. The second electrode 80 is electrically connected to the p-type semiconductor layer 20.

In the example, the first electrode 70 is provided on the second portion 10q of the n-type semiconductor layer 10. The first electrode 70 is electrically connected to the n-type semiconductor layer 10. For example, the second electrode 80 is provided on the p-type semiconductor layer 20 to be electrically connected to the p-type semiconductor layer 20.

In the specification of the application, the state of being "provided on" includes not only the state of being provided in direct contact but also the state in which another layer is inserted therebetween.

A current is supplied to the light emitting layer 30 via the n-type semiconductor layer 10 and the p-type semiconductor layer 20 by applying a voltage between the first electrode 70 and the second electrode 80. Light is emitted from the light emitting layer 30. The semiconductor light emitting element 110 is, for example, a light emitting diode (LED). The semiconductor light emitting element 110 may be a laser diode (LD).

The peak wavelength of the light (the emitted light) emitted from the light emitting layer 30 is, for example, not less than 400 nm and not more than 650 nm.

In the example, the semiconductor light emitting element 110 further includes a stacked body 40. The stacked body 40 is provided between the n-type semiconductor layer 10 and the light emitting layer 30. The stacked body 40 is included in the stacked structural body 90. The stacked body 40 includes, for example, a stacked film of nitride semiconductor layers.

The stacked body 40 includes, for example, multiple first films 41 and multiple second films 42. The multiple first films 41 and the multiple second films 42 are stacked alternately in the Z-axis direction.

The first film 41 includes, for example, a GaN layer. The first film 41 includes, for example, an n-type GaN layer doped with Si. The Si concentration of the first film 41 is, for example, not less than $5 \times 10^{17}$ cm$^{-3}$ and not more than $1 \times 10^{19}$ cm$^{-3}$, e.g., about $2 \times 10^{18}$ cm$^{-3}$. The thickness of the first film 41 is, for example, not less than 1 nm and not more than 5 nm, e.g., 3 nm.

The second film 42 includes, for example, an InGaN layer. The second film 42 includes, for example, an undoped ($0<\alpha<0.1$) layer. The thickness of the second film 42 is, for example, not less than 0.5 nm and not more than 5 nm, e.g., about 1 nm. The stacked body 40 has, for example, a superlattice structure. In the example, the number of second films 42 is, for example, not less than 20 films.

Examples of the light emitting layer 30 and the p-type semiconductor layer 20 will now be described.

FIG. 1 is a model-like illustration of an example of the Al composition ratio for the light emitting layer 30 and the p-type semiconductor layer 20. The horizontal axis is a position dz in the depth direction (the Z-axis direction). The vertical axis is an Al composition ratio CAl.

As shown in FIG. 1, the p-side well layer 32p, the first layer 33a of the p-side barrier layer 31p, the second layer 33b of the p-side barrier layer 31p, the second p-side layer 22, and the third p-side layer 23 are arranged in this order.

The Al composition ratio CAl of the p-side well layer 32p is, for example, substantially 0.

The Al composition ratio z2 of the second layer 33b is higher than the Al composition ratio z1 of the first layer 33a. The Al composition ratio x2 of the second p-side layer 22 is higher than the Al composition ratio z2 of the second layer 33b. The Al composition ratio x3 of the third p-side layer 23 is higher than the Al composition ratio x2 of the second p-side layer 22.

Examples of the p-side well layer 32p, the p-side barrier layer 31p, the second p-side layer 22, and the third p-side layer 23 will now be described.

The p-side well layer 32p includes, for example, $In_{y3}Ga_{1-y3}N$ ($0<y3 \leq 1$ and $y1<y3$). The thickness of the p-side well layer 32p is, for example, not less than 3 nm and not more than 6 nm. For example, the thickness of the p-side well layer 32p may be the same as or different from the thicknesses of the other well layers 32. As described below, the thickness of the p-side well layer 32p may be thicker than the thickness of one of the other well layers 32. The In composition ratio y3 of the p-side well layer 32p may be different from the In composition ratio y2 of one of the other well layers 32.

The first layer 33a of the p-side barrier layer 31p includes $Al_{z1}Ga_{1-z1}N$ ($0 \leq z1$). The Al composition ratio z1 of the p-side barrier layer 31p is, for example, substantially 0. The Al composition ratio z1 is, for example, less than 0.003. For example, the Mg concentration of the first layer 33a is lower than the Mg concentration of the p-type semiconductor layer 20 (e.g., the fourth p-side layer 24). The first layer 33a includes, for example, an undoped GaN layer.

The second layer 33b of the p-side barrier layer 31p includes, for example, an $Al_{z2}Ga_{1-z2}N$ ($z1<z2<x2$) layer. The Al composition ratio z2 of the second layer 33b is, for example, less than 0.03 and not less than 0.003, e.g., 0.01. The Mg concentration of the second layer 33b is lower than the Mg concentration of the p-type semiconductor layer 20 (e.g., the fourth p-side layer 24). The second layer 33b includes, for example, an undoped AlGaN layer.

The thickness of the p-side barrier layer 31p is less than 3.5 nm. The thickness of the first layer 33a is, for example, less than 3 nm and not less than 2 nm. The thickness of the second layer 33b is, for example, less than 1.5 nm and not less than 0.5 nm. The range relating to the thickness of the first layer 33a recited above and the range relating to the thickness of the second layer 33b recited above are set to satisfy the condition that the thickness of the p-side barrier layer 31p is less than 3.5 nm. For example, the total of the thickness of the first layer 33a and the thickness of the second layer 33b is less than 3.5 nm.

The Al composition ratio x2 of the second p-side layer 22 is, for example, less than 0.15 and not less than 0.03, e.g., 0.1. The second p-side layer 22 functions as, for example, a first electron blocking layer to trap electrons in the light emitting layer 30. The Mg concentration of the second p-side layer 22 is not less than $5 \times 10^{18}$ cm$^{-3}$ and not more than $5 \times 10^{19}$ cm$^{-3}$. The thickness of the second p-side layer 22 is, for example, not less than 5 nm and not more than 20 nm, e.g., 7.5 nm.

The third p-side layer 23 includes Mg. For example, an $Al_{x3}Ga_{1-x3}N$ (x2<x3<1) layer is used as the third p-side layer 23. The Al composition ratio x3 of the third p-side layer 23 is, for example, not less than 0.15 and not more than 0.25, e.g., 0.20. The third p-side layer 23 also functions as, for example, a second electron blocking layer to trap electrons in the light emitting layer 30. The Mg concentration of the third p-side layer 23 is higher than the Mg concentration of the second p-side layer 22. The Mg concentration of the third p-side layer 23 is, for example, not less than $5 \times 10^{19}$ cm$^{-3}$ and not more than $3 \times 10^{20}$ cm$^{-3}$. The thickness of the third p-side layer 23 is, for example, not less than 5 nm and not more than 20 nm, e.g., 7.5 nm.

Thus, the Al composition ratio CAl increases in the order of the second layer 33b, the second p-side layer 22, and the third p-side layer 23 from the light emitting layer 30 toward the p-type semiconductor layer 20. In the example, the Al composition ratio CAl changes (increases) in stages.

In the semiconductor light emitting element 110, the thickness of the p-side barrier layer 31p is set to be extremely thin, that is, less than 3.5 nm. Because the thickness of the p-side barrier layer 31p is extremely thin, the p-type semiconductor layer 20 (e.g., the second p-side layer 22) that functions as the electron blocking layer is proximal to the p-side well layer 32p. Therefore, the injection efficiency of the holes is drastically increased; and the radiative recombination probability at the well layer 32 increases.

Also, in the semiconductor light emitting element 110, the Al composition ratio increases along the direction from the second layer 33b of the light emitting layer 30 toward the p-type semiconductor layer 20. For example, an AlGaN layer (the second layer 33b) having an Al composition ratio of 0.01 is provided on the first layer 33a (e.g., the GaN layer) of the p-side barrier layer 31p; an AlGaN layer (the second p-side layer 22) having an Al composition ratio of 0.1 is provided on the AlGaN layer having the Al composition ratio of 0.01; and an AlGaN layer (the third p-side layer 23) having an Al composition ratio of 0.2 is provided on the AlGaN layer having the Al composition ratio of 0.1. Thus, the Al composition ratio x3 of the third p-side layer 23 can be increased by setting the Al composition ratio CAl to be low at the portion (the second layer 33b of the p-side barrier layer 31p) proximal to the well layer 32 and by setting the Al composition ratio CAl to be high at the portion (the third p-side layer 23) distal to the well layer 32.

The crystallinity easily decreases as the Al composition ratio is increased. High crystallinity is obtained in the case where the Al composition ratio is low. By various experiments, the inventor of the application found that the Al composition ratio x3 of the third p-side layer 23 can be increased while maintaining high crystallinity by increasing the Al composition ratio CAl along the direction from the light emitting layer 30 toward the p-type semiconductor layer 20. By setting the Al composition ratio x3 of the third p-side layer 23 to be high, a good electron blocking effect is obtained. Thereby, the luminous efficiency can be increased.

Further, in the embodiment, the diffusion (the movement) of Mg from the p-type semiconductor layer 20 into the light emitting layer 30 can be suppressed.

In the case where the p-type semiconductor layer 20 that includes Mg is proximal to the light emitting layer 30, there are cases where the Mg undesirably diffuses inside the light emitting layer 30; and the quality of the light emitting layer 30 decreases. Therefore, a configuration may be considered in which an intermediate layer (a diffusion prevention layer), etc., is disposed between the light emitting layer 30 and the p-type semiconductor layer 20 such that the p-type semiconductor layer 20 is distal to the light emitting layer 30 (the well layer 32). In such a configuration, the distance between the light emitting layer 30 and the p-type semiconductor layer 20 is long, e.g., not less than 4 nm. In some cases, the distance is set to be 6 nm or more.

According to investigations of the inventor of the application, it was discovered that, in the case where the Al composition ratio CAl of the electron blocking layer that includes Mg is high, the degree of the diffusion (the movement) of the Mg from the electron blocking layer into the light emitting layer 30 is large; but in the case where the Al composition ratio CAl of the electron blocking layer that includes Mg is low, the degree of the diffusion (the movement) of the Mg is small. It is considered that, in the case where the Al composition ratio is high, the Mg easily desorbs because the crystallinity is poor. For example, it is considered that, in the case where the Al composition ratio x2 of the second p-side layer 22 is high, the Mg included in the second p-side layer 22 easily desorbs; and the desorbed Mg moves easily into the well layer 32. In the case where the Al composition ratio x2 of the second p-side layer 22 is low, the Mg included in the second p-side layer 22 does not desorb easily; and the Mg does not move easily into the well layer 32.

In the case where the Al composition ratio x2 of the second p-side layer 22 is set to be low to suppress the diffusion of the Mg, the electron blocking effect becomes small. In the embodiment, a good electron blocking effect is obtained by increasing the Al composition ratio x3 of the third p-side layer 23 distal to the well layer 32. Also, the second p-side layer 22 can be proximal to the well layer 32 because the diffusion (the movement) of the Mg can be suppressed. Thereby, the injection efficiency of the holes increases.

Thus, in the semiconductor light emitting element 110 according to the embodiment, the Al composition ratio is increased along the direction from the light emitting layer 30 toward the p-type semiconductor layer 20. The electron blocking layer (e.g., the second p-side layer 22) can be proximal to the light emitting layer 30 because the Al composition ratio of the portion proximal to the light emitting layer 30 is low and the diffusion of the Mg into the light emitting layer 30 can be suppressed. Thereby, the injection efficiency of the holes can be increased. Also, the Al composition ratio x3 of the third p-side layer 23 can be high and the blocking efficiency of the electrons can be increased while maintaining high crystallinity. Thereby, a high luminous efficiency is obtained.

In the light emitting layer 30 having the multiple quantum well structure, for example, a GaN layer and a layer including In (an InGaN layer) are stacked alternately. In the light emitting layer 30, the InGaN layer that includes In is formed coherently on the GaN layer that has a lattice constant different from that of the InGaN layer. Thereby, stress accumulates inside the light emitting layer 30. Inside the light emitting layer 30, the stress increases and crystal defects occur easily toward the p-type semiconductor layer 20. Moreover, stress accumulates inside the stacked body 40 that has the superlattice structure. Inside the stacked body 40 as well, the stress increases and crystal defects occur easily toward the p-type semiconductor layer 20.

To increase the electron blocking effect, it is desirable to increase the Al composition ratio of the p-type semiconductor layer 20. However, in the case where an electron blocking layer having a high Al composition ratio is disposed proximally to the light emitting layer 30, the lattice mismatch becomes pronounced; and crystal defects are introduced easily due to the mismatch of the lattice constants. In particular, in the case where the Al composition is high and the layer is thick, the crystal defects occur more easily. The crystal defects reduce the luminous efficiency of the semiconductor light emitting element.

It is considered that the stress that accumulates in the light emitting layer 30 can be relaxed and the introduction of crystal defects is reduced by the counterbalance provided by disposing a layer including Al (e.g., the second layer 33b of the p-side barrier layer 31p and/or the second p-side layer 22 of the p-type semiconductor layer 20) proximally to the InGaN layer (the p-side well layer 32p) of the light emitting layer 30.

Conversely, in the case where an Al-containing layer that has an Al composition ratio CAl that is excessively high is disposed proximally to the p-side well layer 32p, the composition mismatch is too large; and crystal defects due to mismatch occur easily. In the embodiment, the occurrence of crystal defects due to mismatch can be suppressed by inserting a second p-side layer 22 that has a low Al composition ratio CAl between the p-side well layer 32p and the layer (the third p-side layer 23) that has a high Al composition ratio CAl. Thereby, the crystallinity increases; and the luminous efficiency increases.

In the semiconductor light emitting element 110 according to the embodiment, the layer having a high Al composition ratio (e.g., the third p-side layer 23) is disposed inside the p-type semiconductor layer 20 at a position distal to the light emitting layer 30 while disposing the electron blocking layer (e.g., the second p-side layer 22) of the p-type semiconductor layer 20 proximally to the light emitting layer 30. The Al composition ratio is increased along the direction from the light emitting layer 30 toward the p-type semiconductor layer 20. Thereby, the lattice length changes gradually rather than abruptly. Also, the stress is relaxed gradually. Mismatch of the lattice constants does not occur easily; and the occurrence of crystal defects can be suppressed. It is possible to increase the electron blocking effect because the Al composition ratio CAl of the electron blocking layer can be set to be high. Thereby, the luminous efficiency can be increased overall in a wide current region.

Figure 3:
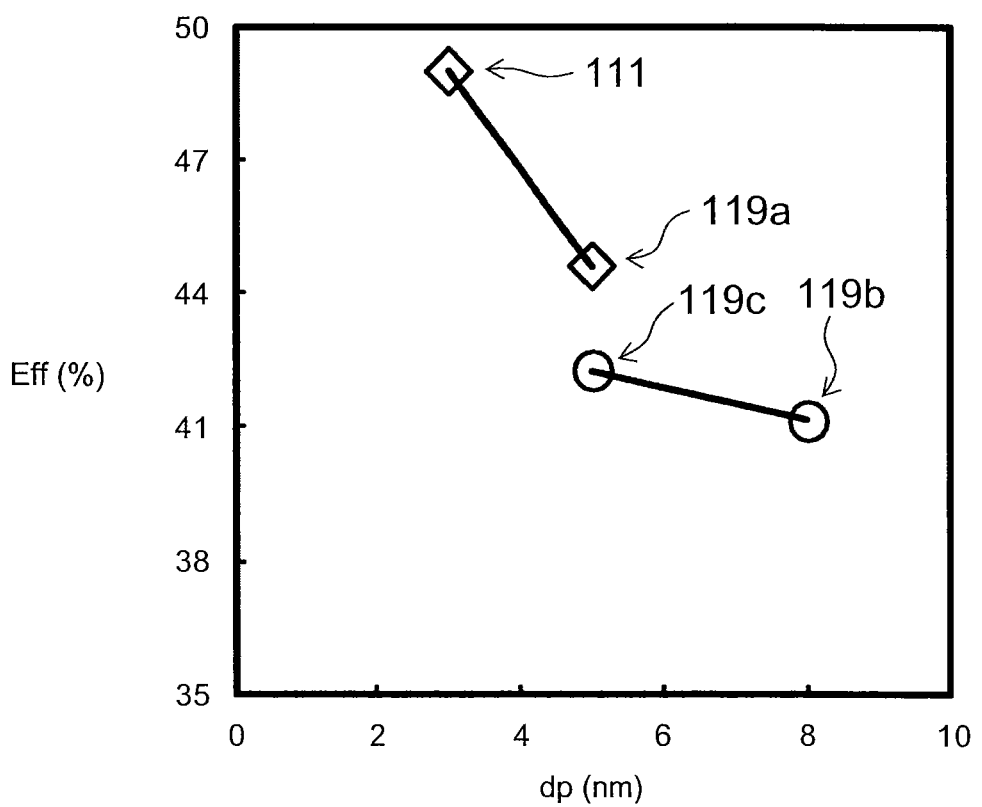
FIG. 3 is a graph illustrating a characteristic of the semiconductor light emitting element according to the first embodiment.

FIG. 3 is a graph illustrating a characteristic of the semiconductor light emitting element according to the first embodiment.

FIG. 3 is a graph showing the luminous efficiency of the semiconductor light emitting element. The horizontal axis is a thickness dp (nanometers (nm)) of the p-side barrier layer 31p. The vertical axis is a luminous efficiency Eff (milliwatt/milliampere (mW/mA)). The luminous efficiency Eff corresponds to the value of the intensity of the light radiated from the semiconductor light emitting element divided by a current Id supplied to the semiconductor light emitting element. FIG. 3 shows the luminous efficiency Eff when the current Id is 100 mA.

In addition to the characteristic of the semiconductor light emitting element 111 according to the embodiment, FIG. 3 also shows characteristics of semiconductor light emitting elements 119a to 119c of first to third reference examples (the cross-sectional views are not shown).

The semiconductor light emitting element 111 has the configuration of the semiconductor light emitting element 110 described in regard to FIG. 1 and FIG. 2. The specific configuration of the semiconductor light emitting element 111 will now be described.

The semiconductor light emitting element 111 includes the stacked structural body 90. A buffer layer (not shown), an undoped GaN layer (the foundation layer 60) having a thickness of 3 μm, an n-type GaN layer (the n-type semiconductor layer 10) having a thickness of 5 μm and a Si concentration of $8 \times 10^{18}$ atoms/cm$^3$, the stacked body 40, the light emitting layer 30, and the p-type semiconductor layer 20 are stacked in this order on the substrate 50 of c-plane sapphire in the stacked structural body 90.

In the stacked body 40, for example, thirty periods of an n-type GaN layer (the first film 41) having a thickness of 3 nm and a Si concentration of $2 \times 10^{18}$ atoms/cm$^3$ and an undoped InGaN layer (the second film 42) having a thickness of 1 nm and an In composition ratio of 0.07 are stacked alternately.

In the light emitting layer 30, for example, eight pairs of a GaN layer (the barrier layer 31) having a thickness of 5 nm and an InGaN layer (the well layer 32 and the p-side well layer 32p) having a thickness of 3.5 nm are stacked. The final well layer 32 of the eight pairs is used as the p-side well layer 32p. In the example, the In composition ratio is 0.13 for the p-side well layer 32p and the other well layers 32. The thickness of the p-side well layer 32p is the same as the thicknesses of the other well layers 32. The p-side barrier layer 31p is stacked on the p-side well layer 32p. In other words, a GaN layer that is used to form the first layer 33a of the p-side barrier layer 31p is formed. The Al composition ratio z1 of the first layer 33a is 0. An undoped AlGaN layer having an Al composition ratio z2 of 0.01 that is used to form the second layer 33b of the p-side barrier layer 31p is formed on the GaN layer. The total thickness of the second layer 33b is 3 nm. For example, the thickness of the first layer 33a is 2 nm; and the thickness of the second layer 33b is 1 nm.

The second p-side layer 22, the third p-side layer 23, the fourth p-side layer 24, and the first p-side layer 21 are stacked in this order as the p-type semiconductor layer 20. For example, a p-type AlGaN layer having a thickness of 7.5 nm, an Al composition ratio x2 of 0.1, and a Mg concentration not less than about $1 \times 10^{19}$ and not more than about $1 \times 10^{20}$ cm$^{-3}$ is formed as the second p-side layer 22. A p-type AlGaN layer having a thickness of 7.5 nm, an Al composition ratio x3 of 0.2, and a Mg concentration not less than about $1 \times 10^{20}$ and not more than about $3 \times 10^{20}$ cm$^{-3}$ is formed as the third p-side layer 23 on the p-type AlGaN layer. A p-type GaN layer having a thickness of 80 nm and a Mg concentration of about $2 \times 10^{19}$ cm$^{-3}$ is formed as the fourth p-side layer 24 on the p-type AlGaN layer. A p-type GaN layer having a thickness of 10 nm and a Mg concentration of about $1 \times 10^{21}$ cm$^{-3}$ is formed as the first p-side layer 21 on the p-type GaN layer.

In the stacked structural body 90, a portion of the n-type semiconductor layer 10 is exposed by etching from the front surface side of the p-type semiconductor layer 20. A Ti film/Pt film/Au film (the first electrode 70) is formed on the n-type semiconductor layer 10 that is exposed. A Ni film/Au film (the second electrode 80) is formed on the p-type GaN layer (the first p-side layer 21) which is the contact layer.

On the other hand, in a semiconductor light emitting element 119a of a first reference example, the thickness of the first layer 33a (the GaN layer) of the p-side barrier layer 31p is 3 nm; and the thickness of the second layer 33b (the undoped AlGaN layer) of the p-side barrier layer 31p is 2 nm. Otherwise, the configuration is the same as that of the semiconductor light emitting element 111. In the semiconductor light emitting element 119a, the thickness of the p-side barrier layer 31p is 5 nm; and the Al composition ratio x3 of the third p-side layer 23 is higher than the Al composition ratio x2 of the second p-side layer 22.

In a semiconductor light emitting element 119b of a second reference example, the thickness of the first layer 33a (the GaN layer) of the p-side barrier layer 31p is 5 nm; the thickness of the second layer 33b (the undoped AlGaN layer) of the p-side barrier layer 31p is 3 nm; and the Al composition ratio x3 of the third p-side layer 23 (the p-type AlGaN layer) is 0.1. Otherwise, the configuration is the same as that of the semiconductor light emitting element 111. In the semiconductor light emitting element 119b, the thickness of the p-side barrier layer 31p is 8 nm; and the Al composition ratio x3 of the third p-side layer 23 is the same as the Al composition ratio x2 of the second p-side layer 22.

In a semiconductor light emitting element 119c of a third reference example, the thickness of the first layer 33a (the GaN layer) of the p-side barrier layer 31p is 3 nm; the thickness of the second layer 33b (the undoped AlGaN layer) of the p-side barrier layer 31p is 2 nm; and the Al composition ratio x3 of the third p-side layer 23 (the p-type AlGaN layer) is 0.1. Otherwise, the configuration is the same as that of the semiconductor light emitting element 111. In the semiconductor light emitting element 119c, the thickness of the p-side barrier layer 31p is 5 nm; and the Al composition ratio x3 of the third p-side layer 23 is the same as the Al composition ratio x2 of the second p-side layer 22.

As shown in FIG. 3, the luminous efficiency Eff of the semiconductor light emitting element 119a is 45%. The luminous efficiency Eff of the semiconductor light emitting element 119c is 42%. The luminous efficiency Eff of the semiconductor light emitting element 119a is higher than that of the semiconductor light emitting element 119c. For the former, the Al composition ratio x3 of the third p-side layer 23 is higher than the Al composition ratio x2 of the second p-side layer 22. For the latter, the Al composition ratio x3 of the third p-side layer 23 is the same as the Al composition ratio x2 of the second p-side layer 22. It can be seen that the luminous efficiency Eff can be improved by setting the Al composition ratio x3 of the third p-side layer 23 to be higher than the Al composition ratio x2 of the second p-side layer 22.

The luminous efficiency Eff of the semiconductor light emitting element 119b is 41%. The luminous efficiency Eff of the semiconductor light emitting element 119c is higher than that of the semiconductor light emitting element 119b. The thickness (5 nm) of the p-side barrier layer 31p of the former is thinner than the thickness (8 nm) of the p-side barrier layer 31p of the latter. Therefore, it can be seen that the luminous efficiency Eff can be improved when the thickness of the p-side barrier layer 31p is thinner.

On the other hand, the luminous efficiency Eff of the semiconductor light emitting element 111 is 49%. A higher luminous efficiency Eff is obtained for the semiconductor light emitting element 111 than for any of the semiconductor light emitting elements 119a to 119c. In the semiconductor light emitting element 111, the Al composition ratio x3 of the third p-side layer 23 is higher than the Al composition ratio x2 of the second p-side layer 22; and the thickness of the p-side barrier layer 31p is thin, i.e., 3 nm.

It was found that the improvement effect of the luminous efficiency is particularly high when the distance between the p-side well layer 32p and the second p-side layer 22 (in the example, corresponding to the thickness of the p-side barrier layer 31p) is less than 3 nm.

Figure 4A:
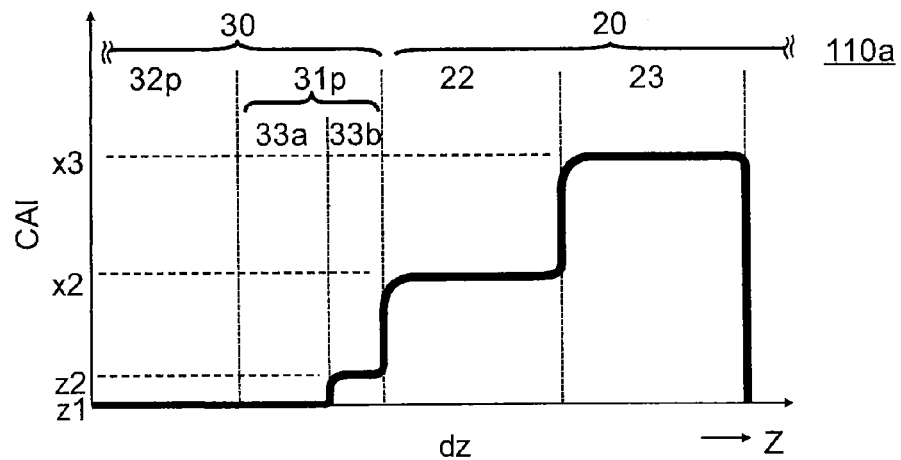
FIG. 4A to FIG. 4C are schematic views illustrating another semiconductor light emitting elements according to the first embodiment.
Figure 4B:
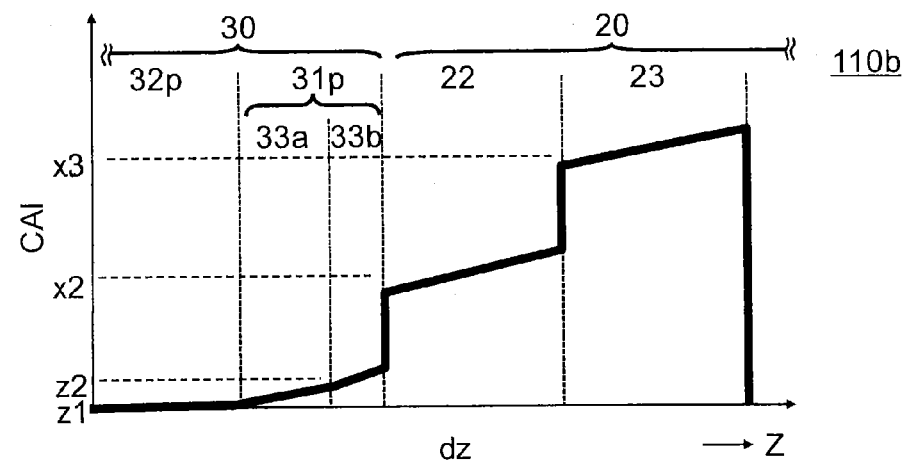
Figure 4C:
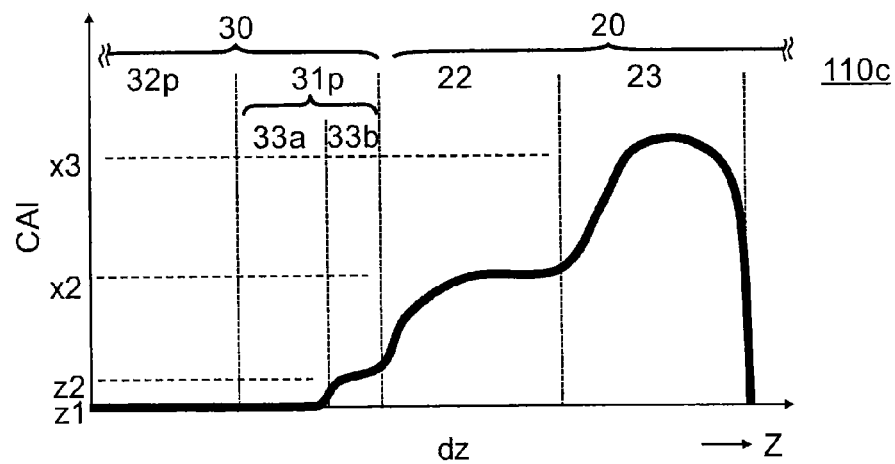

FIG. 4A to FIG. 4C are schematic views illustrating other semiconductor light emitting elements according to the first embodiment.

FIG. 4A to FIG. 4C respectively show examples of the Al composition ratio for the semiconductor light emitting elements 110a to 110c according to the first embodiment. The horizontal axis is the position dz in the depth direction (the Z-axis direction); and the vertical axis is the Al composition ratio CAl.

As shown in FIG. 4A, the Al composition ratio CAl of the semiconductor light emitting element 110a changes gradually between the first layer 33a and the second layer 33b, between the second layer 33b and the second p-side layer 22, and between the second p-side layer 22 and the third p-side layer 23. In the example, the Al composition ratio CAl is substantially constant inside each of the layers. The Al composition ratio CAl increases along the direction from the p-side barrier layer 31p toward the p-type semiconductor layer 20.

As shown in FIG. 4B, the Al composition ratio CAl of the semiconductor light emitting element 110b changes (increases) in each of the layers.

As shown in FIG. 4C, the Al composition ratio CAl of the semiconductor light emitting element 110c changes continuously between the layers and inside each of the layers.

In the semiconductor light emitting elements 110a to 110c as well, the Al composition ratio CAl increases along the direction from the p-side barrier layer 31p toward the p-type semiconductor layer 20. Also, the thickness of the p-side barrier layer 31p is less than 3.5 nm. In these semiconductor light emitting elements as well, a high luminous efficiency is obtained.

The thickness of each layer can be sensed by, for example, a transmission electron microscope (TEM), a scanning electron microscope (SEM), etc. The composition ratio and impurity concentration (the Mg concentration, etc.) of each of the layers can be sensed by, for example, secondary ion mass spectrometry. Energy dispersive X-ray spectroscopy may be used.

In the embodiment, for example, a sapphire substrate (e.g., a c-plane sapphire substrate) is used as the substrate 50. The substrate 50 may include, for example, a substrate of GaN, SiC, ZnO, Si, etc. For example, the stacked structural body 90 is formed on the substrate 50. The formation is performed by, for example, epitaxial growth. The substrate 50 may be removed after the formation of the stacked structural body 90.

For example, an undoped GaN layer is used as the foundation layer 60. The thickness of the foundation layer 60 is, for example, not less than about 1 μm and not more than about 5 μm, e.g., about 3 μm. At least a portion of the foundation layer 60 may be removed when removing the substrate 50. A buffer layer also may be provided between the substrate 50 and the foundation layer 60. An AlGaN layer may be used as the foundation layer 60. A stacked film of multiple nitride semiconductor layers may be used as at least one selected from the foundation layer 60 and the buffer layer.

The first electrode 70 includes, for example, a stacked film of a Ti film/Pt film/Au film. The second electrode 80 includes, for example, a stacked film of a Ni film/Au film.

An example of a method for manufacturing the semiconductor light emitting element according to the embodiment will now be described.

For example, organic cleaning and acid cleaning of the substrate 50 of c-plane sapphire, etc., are performed. After the cleaning, crystal growth of the buffer layer, the foundation layer 60, the n-type semiconductor layer 10, the stacked body 40, the light emitting layer 30, and the p-type semiconductor layer 20 is performed in order on the substrate 50. Thereby, the stacked structural body 90 is formed on the substrate 50. The buffer layer is formed if necessary.

For example, MOCVD (Metal Organic Chemical Vapor Deposition) is used to form the stacked structural body 90. Hydride vapor phase epitaxy (HVPE), molecular beam epitaxy (MBE), etc., may be used to form these layers. An example in which the stacked structural body 90 is formed by MOCVD will now be described.

After the cleaning, the substrate 50 is placed inside the reaction chamber of a MOCVD apparatus. The temperature of the substrate 50 is increased to 1160° C. by resistance heating in an atmospheric pressure mixed gas atmosphere of nitrogen ($N_2$) gas and hydrogen ($H_2$) gas. Thereby, gas phase etching of the front surface of the substrate 50 is performed; and the native oxide film that was formed on the front surface is removed.

The temperature of the substrate 50 is reduced to 530° C. A buffer layer (a low-temperature buffer layer) is formed on the substrate 50. A carrier gas and a process gas are supplied to form the buffer layer. For example, a gas mixture of $N_2$ gas and $H_2$ gas is used as the carrier gas. In the example, a group V source-material gas, a gas including Ga, and a gas including Al are supplied as the process gas. For example, ammonia ($NH_3$) gas is used as the group V source-material gas. For example, tri-methyl gallium (TMG) is used as the gas including Ga. For example, tri-ethyl gallium (TEG) may be used as the gas including Ga. For example, tri-methyl aluminum (TMA) is used as the gas including Al.

For example, an undoped GaN layer is formed as the foundation layer 60. The supply of TMG and TMA is stopped while continuing the supply of $NH_3$. The temperature is increased to 1160° C. TMG is supplied again while maintaining the temperature at 1160° C. Thereby, the foundation layer 60 is formed.

For example, an n-type GaN layer is formed as the n-type semiconductor layer 10. Further, a gas including Si is supplied without changing the process gas. For example, silane ($SiH_4$) gas is used as the gas including Si. The temperature of the substrate 50 is 1160° C.

The supply of TMG and $SiH_4$ gas is stopped while continuing the supply of $NH_3$. The temperature of the substrate 50 is reduced to 800° C. and is maintained at 800° C.

For example, an n-type GaN layer is formed as the first film 41 of the stacked body 40. The temperature of the substrate 50 is 800° C. $N_2$ gas is used as the carrier gas. $NH_3$, TMG, and $SiH_4$ gas are used as the process gas.

For example, an undoped $In_{y3}Ga_{1-y3}N$ (0<y3<0.1) layer is formed as the second film 42 of the stacked body 40. In the formation of the second film 42, the supply of $SiH_4$ gas is stopped; and a gas including In is supplied. For example, tri-methyl indium (TMI) is used as the gas including In. The temperature of the substrate 50 is 800° C.

The formation of the first film 41 recited above and the formation of the second film 42 recited above are multiply repeated. In other words, the supply of $SiH_4$ gas and the supply of TMI are alternately repeated. The number of repetitions is, for example, thirty periods. Thereby, the stacked body 40 having the superlattice structure is formed.

The light emitting layer 30 is formed. First, for example, a GaN layer is formed as the barrier layer 31. The supply of TMG, TMI, and $SiH_4$ gas is stopped. The temperature of the substrate 50 is increased to 880° C. while continuing the supply of $N_2$ gas and $NH_3$ gas. Subsequently, TMG is supplied.

For example, an $In_{y2}Ga_{1-y2}N$ layer (0<y2<1) is formed as the well layer 32. In the formation of the well layer 32, only the supply of TMG is stopped; and the temperature of the substrate 50 is reduced to 820° C. Subsequently, TMG and TMI are supplied.

For example, the formation of the barrier layer 31 recited above and the formation of the well layer 32 recited above are multiply repeated. The number of repetitions is, for example, eight periods.

The final barrier layer (the p-side barrier layer 31p) is formed on the p-side well layer 32p. The supply of TMG and TMI is stopped. The temperature of the substrate 50 is increased to 880° C. and maintained while continuing the supply of $N_2$ gas and $NH_3$ gas. Subsequently, TMG is supplied. Thereby, a GaN layer (the first layer 33a of the p-side barrier layer 31p) is formed.

For example, an AlGaN layer (the second layer 33b of the p-side barrier layer 31p) is formed on the GaN layer. The AlGaN layer is, for example, undoped. The AlGaN layer is formed by continuing the supply of the process gas as-is and by also supplying TMA.

Then, the supply of TMG and TMA is stopped while continuing the supply of $NH_3$. The temperature of the substrate 50 is increased to 1030° C. and maintained in a $N_2$ gas atmosphere.

A p-type AlGaN layer (the second p-side layer 22) is formed at a substrate temperature of 1030° C. A gas mixture of $N_2$ gas and $H_2$ gas is used as the carrier gas. A gas including $NH_3$, TMG, TMA, and Mg is supplied as the process gas. For example, bis(cyclopentadienyl)magnesium ($Cp_2Mg$) is used as the gas including Mg.

Then, a p-type AlGaN layer (the third p-side layer 23) is formed by increasing the supply amount of TMA.

A p-type GaN layer (the fourth p-side layer 24) that is used to form the p-type clad layer is formed by stopping the supply of TMA while continuing the supply of TMG and $Cp_2Mg$.

Then, a p-type GaN layer (the first p-side layer 21) that is used to form the p-type contact layer is formed by increasing the supply amount of $Cp_2Mg$.

The supply of TMG and $Cp_2Mg$ is stopped while continuing the supply of $NH_3$. In other words, the supply of all of the process gases is stopped. The supply of the carrier gas is continued. The temperature of the substrate 50 is allowed to fall naturally. The supply of $NH_3$ is continued until the temperature of the substrate 50 reaches 300° C.

The substrate 50 is extracted from the reaction chamber of the MOCVD apparatus.

A portion of the stacked structural body 90 is removed from the p-type semiconductor layer 20 side until the n-type semiconductor layer 10 is reached. For example, RIE (Reactive Ion Etching) is used to remove the stacked structural body 90. The first electrode 70 is formed on the n-type semiconductor layer 10 that is exposed. The second electrode 80 is formed on the first p-side layer 21.

Thereby, the semiconductor light emitting element (e.g., the semiconductor light emitting element 110) according to the embodiment is formed. After forming the stacked structural body 90 on the substrate 50, the substrate 50 may be removed. A portion of the foundation layer 60 may be removed when removing the substrate 50.

Second Embodiment

Figure 5:
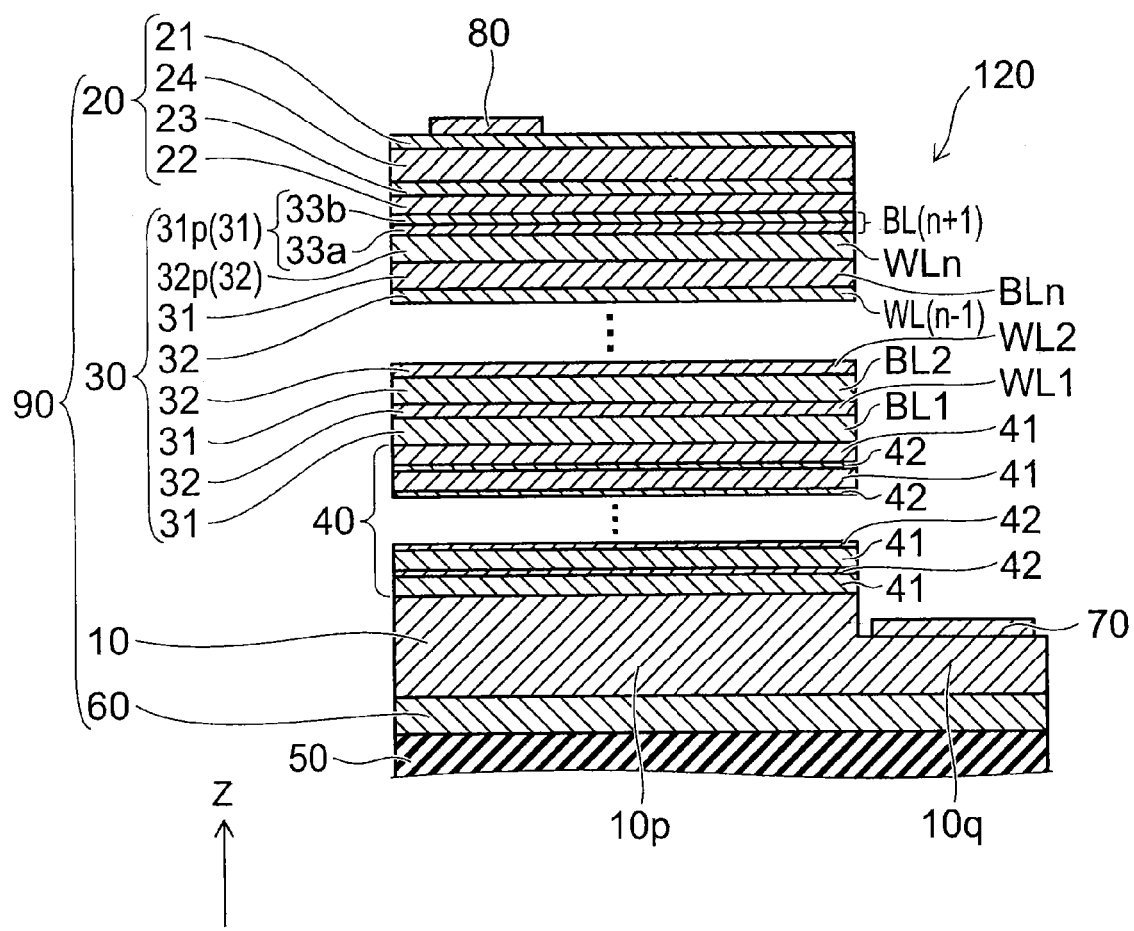
FIG. 5 is a schematic cross-sectional view illustrating a semiconductor light emitting element according to a second embodiment.

FIG. 5 is a schematic cross-sectional view illustrating a semiconductor light emitting element according to a second embodiment.

In the semiconductor light emitting element 120 according to the embodiment as shown in FIG. 5, the configuration of the p-side well layer 32p is different from the configuration of one other well layer 32 of the multiple well layers 32. The configuration of the one other well layer 32 may be similar to that of the semiconductor light emitting element 110; and a description is therefore omitted.

Among the multiple well layers 32 included in the light emitting layer 30 of the semiconductor light emitting element 120, the thickness of the p-side well layer 32p is thickest. For example, in the semiconductor light emitting element 120, the thickness of the p-side well layer 32p is about 5 nm. The thickness of the other well layers 32 other than the p-side well layer 32p is about 3.5 nm.

In the example, the In composition ratio of the p-side well layer 32p is lower than the In composition ratio of the other well layers 32. The In composition ratio of the p-side well layer 32p is, for example, 0.12. The In composition ratio of the other well layers 32 is 0.13.

Figure 6:
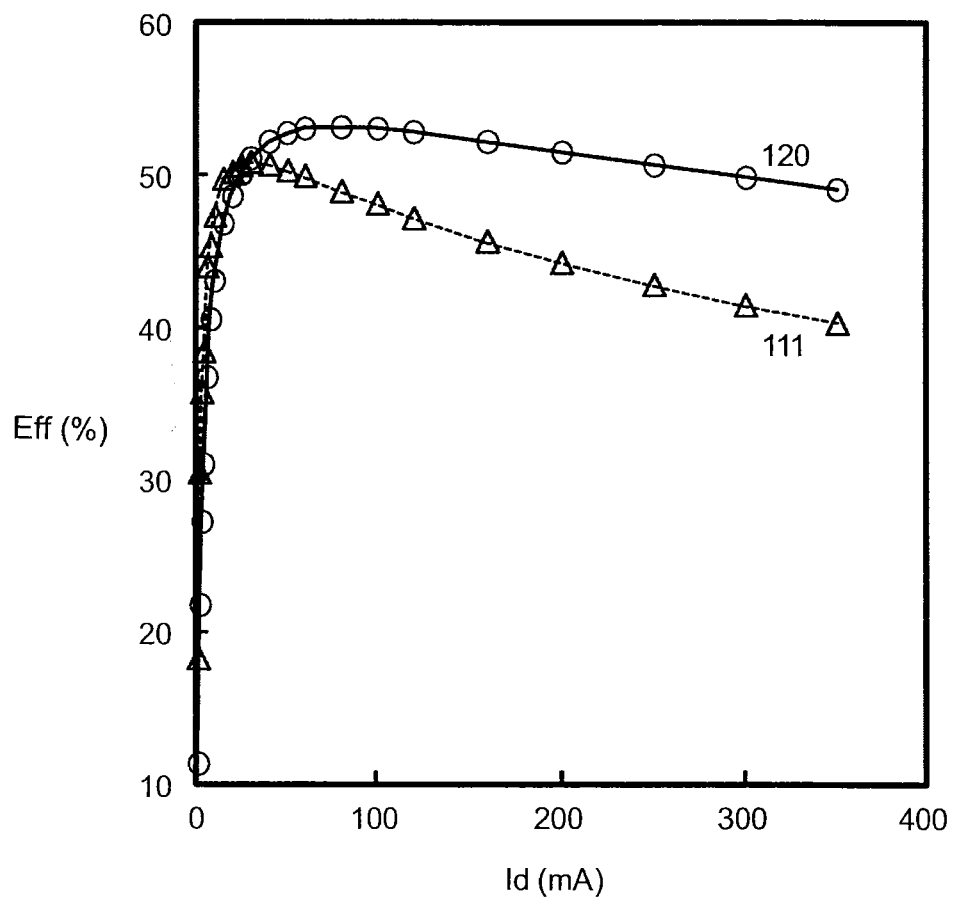
FIG. 6 is a graph illustrating a characteristic of the semiconductor light emitting element according to the second embodiment.

FIG. 6 is a graph illustrating a characteristic of the semiconductor light emitting element according to the second embodiment.

FIG. 6 shows the luminous efficiency of the semiconductor light emitting element 120 and the luminous efficiency of the semiconductor light emitting element 111. The horizontal axis is the current Id (milliamperes (mA)); and the vertical axis is the luminous efficiency Eff (milliwatt/milliampere (mW/mA)). The luminous efficiency Eff corresponds to the value of the intensity of the light radiated from the semiconductor light emitting element divided by the current Id supplied to the semiconductor light emitting element.

As shown in FIG. 6, the luminous efficiency Eff is higher for the semiconductor light emitting element 120 than for the semiconductor light emitting element 110 in which the thickness of the p-side well layer 32p is the same as that of the other well layers 32.

By increasing the volume of the well layer 32, the increase of the current density (the charge density) in the well layer 32 is suppressed even in the case where the current Id supplied to the semiconductor light emitting element increases. Thereby, the current concentration (the charge concentration) in the well layer 32 can be suppressed. Accordingly, overflow of electrons from the light emitting layer 30 is suppressed; and the hole carrier injection efficiency is increased further. In particular, the volume of the p-side well layer 32p is increased by setting the thickness of the p-side well layer 32p to be thicker than the thickness of the other well layers 32. Thereby, the current concentration in the p-side well layer 32p can be maintained at a low level. Thereby, the current concentration in the p-side well layer 32p which has a high contribution to the light emission can be suppressed; and the luminous efficiency of the p-side well layer 32p can be increased.

In the semiconductor light emitting element 120 as well, an electron blocking layer (e.g., the second p-side layer 22) is disposed proximally to the p-side well layer 32p; and the Al composition ratio CAl gradually increases along the direction from the light emitting layer 30 toward the p-type semiconductor layer 20. Thereby, the luminous efficiency of the semiconductor light emitting element 120 can be even higher.

The stress that accumulates in the light emitting layer 30 becomes large in the case where the InGaN layer which is the well layer 32 is set to be thick. Therefore, crystal defects are introduced easily; and it becomes difficult to maintain a high-quality crystal.

In the semiconductor light emitting element 120 which is the embodiment, not only is the p-side well layer 32p thicker, but also the AlGaN layer in which the Al composition ratio CAl increases is disposed proximally to the p-side well layer 32p. Thereby, the stress is relaxed easily even in the case where the p-side well layer 32p is thick. Also, the luminous efficiency Eff is drastically increased because good electron blocking also is maintained because the AlGaN layer that has a high Al composition ratio is included. In the semiconductor light emitting element 120 as well, a high luminous efficiency is obtained.

The thickness of the p-side barrier layer 31p (the first layer 33a and the second layer 33b) of the light emitting layer 30 in the first and second embodiments recited above is an example. The thickness, Al composition ratio, and Mg concentration of the p-type semiconductor layer 20 (e.g., the second p-side layer 22 and the third p-side layer 23) are examples. In the embodiment, various modifications are possible for the thickness, composition ratio, and Mg concentration of each layer.

Third Embodiment

The embodiment relates to a method for manufacturing the semiconductor light emitting element that includes the n-type semiconductor layer 10, the p-type semiconductor layer 20, and the light emitting layer 30 including nitride semiconductors. The p-type semiconductor layer 20 includes the first p-side layer 21 of $Al_{x1}Ga_{1-x1}N$ ($0 \leq x1 < 1$) including Mg, the second p-side layer 22 of $Al_{x2}Ga_{1-x2}N$ ($0 < x2 < 1$) including Mg provided between the first p-side layer 21 and the n-type semiconductor layer 10, and the third p-side layer of $Al_{x3}Ga_{1-x3}N$ ($x2 < x3 < 1$) including Mg provided between the first p-side layer 21 and the second p-side layer 22. The light emitting layer 30 is provided between the n-type semiconductor layer and the second p-side layer. The light emitting layer 30 includes the multiple barrier layers 31 and the multiple well layers 32. The multiple well layers 32 are provided respectively between the multiple barrier layers 31.

Figure 7:
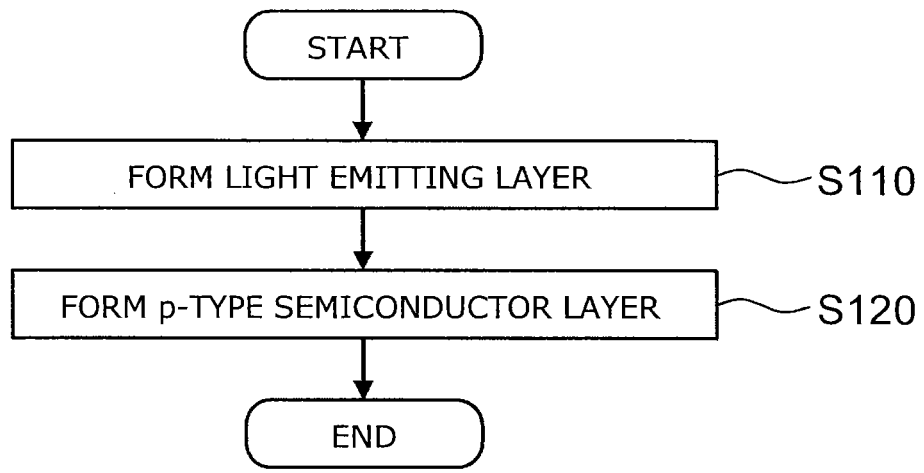
FIG. 7 is a flowchart illustrating the method for manufacturing the semiconductor light emitting element according to the third embodiment.

FIG. 7 is a flowchart illustrating the method for manufacturing the semiconductor light emitting element according to the third embodiment.

As shown in FIG. 7, the manufacturing method includes a process (step S110) of forming the light emitting layer 30 on the n-type semiconductor layer 10 and a process (step S120) of forming the p-type semiconductor layer 20 on the light emitting layer 30.

The formation of the light emitting layer 30 (step S110) includes forming the light emitting layer 30 such that the p-side barrier layer 31p of the multiple barrier layers 31 that is most proximal to the second p-side layer 22 includes the first layer 33a and the second layer 33b; and the thickness of the p-side barrier layer 31p is less than 3.5 nm. The first layer 33a is provided between the n-type semiconductor layer 10 and the second p-side layer 22 and includes $Al_{z1}Ga_{1-z1}N$ ($0 \leq z1$). The second layer 33b is provided between the first layer 33a and the second p-side layer 22 to contact the first layer and the second p-side layer 22 and includes $Al_{z2}Ga_{1-z2}N$ ($z1 < z2 < x2$).

For example, the manufacturing method described in regard to the semiconductor light emitting element 110 or 111 according to the first embodiment is implemented. According to the method for manufacturing the semiconductor light emitting element according to the embodiment, a semiconductor light emitting element having a high luminous efficiency and a method for manufacturing the semiconductor light emitting element can be provided.

According to the embodiments, a semiconductor light emitting element having a high luminous efficiency and a method for manufacturing the semiconductor light emitting element can be provided.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the semiconductor light emitting element such as the substrate, the buffer layer, the foundation layer, the semiconductor layer, the stacked body, the light emitting layer, the electrode, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all semiconductor light emitting elements and methods for manufacturing the same practicable by an appropriate design modification by one skilled in the art based on the semiconductor light emitting elements and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element, comprising:
   an n-type semiconductor layer including a nitride semiconductor;
   a p-type semiconductor layer including
      a first p-side layer of $Al_{x1}Ga_{1-x1}N$ ($0 \le x1 < 1$) including Mg,
      a second p-side layer of $Al_{x2}Ga_{1-x2}N$ ($0 < x2 < 1$) including Mg provided between the first p-side layer and the n-type semiconductor layer, and
      a third p-side layer of $Al_{x3}Ga_{1-x3}N$ ($x2 < x3 < 1$) including Mg provided between the first p-side layer and the second p-side layer; and
   a light emitting layer provided between the n-type semiconductor layer and the second p-side layer, the light emitting layer including a plurality of barrier layers and a plurality of well layers provided respectively between the barrier layers,
   a p-side barrier layer of the barrier layers most proximal to the second p-side layer including
      a first layer of $Al_{z1}Ga_{1-z1}N$ ($0 \le z1$), and
      a second layer of $Al_{z2}Ga_{1-z2}N$ ($z1 < z2 < x2$) provided between the first layer and the second p-side layer to contact the first layer and the second p-side layer,
   a thickness of the p-side barrier layer being less than 3.5 nanometers,
   wherein a thickness of a p-side well layer of the plurality of well layers most proximal to the second p-side layer is thicker than a thickness of the one other well layer of the plurality of well layers.

2. The element according to claim 1, wherein the thickness of the p-side well layer is not less than 3 nanometers and not more than 6 nanometers.

3. The element according to claim 2, wherein a thickness of a well layer of the plurality of well layers other than the p-side well layer is less than 6 nanometers and not less than 1.5 nanometers.

4. The element according to claim 1, wherein
   each of the plurality of well layers includes In, and
   an In composition ratio of the p-side well layer is lower than an In composition ratio of the one other well layer of the plurality of well layers.

5. The element according to claim 1, wherein the x3 is not less than 0.15 and not more than 0.25.

6. The element according to claim 1, wherein the x2 is less than 0.15 and not less than 0.03.

7. The element according to claim 1, wherein the z2 is less than 0.03 and not less than 0.003.

8. The element according to claim 1, wherein a thickness of the first layer is thicker than a thickness of the second layer.

9. The element according to claim 1, wherein a thickness of the first layer is less than 3 nanometers and not less than 2 nanometers.

10. The element according to claim 9, wherein a thickness of the second layer is less than 1.5 nanometers and not less than 0.5 nanometers.

11. The element according to claim 1, wherein a total of a thickness of the first layer and a thickness of the second layer is less than 3.5 nanometers.

12. The element according to claim 1, wherein a thickness of the second p-side layer is not less than 5 nanometers and not more than 20 nanometers.

13. The element according to claim 1, wherein a thickness of the third p-side layer is not less than 5 nanometers and not more than 20 nanometers.

14. The element according to claim 1, wherein the p-type semiconductor layer further includes a fourth p-side layer of $Al_{x4}Ga_{1-x4}N$ ($0 \le x4 < 1$ and $x4 < x3$) including Mg provided between the first p-side layer and the third p-side layer.

15. The element according to claim 14, wherein the x4 is less than the x2.

16. The element according to claim 1, wherein a barrier layer of the plurality of barrier layers other than the p-side barrier layer is a GaN layer.

17. The element according to claim 1, wherein a peak wavelength of light emitted from the light emitting layer is not less than 400 nanometers and not more than 650 nanometers.

18. The element according to claim 1, wherein the plurality of well layers include $In_{y2}Ga_{1-y2}N$ (0.08≤y2≤0.18).

19. A method for manufacturing a semiconductor light emitting element, the element including an n-type semiconductor layer, a p-type semiconductor layer, and a light emitting layer provided between the n-type semiconductor layer and a second p-side layer, the n-type semiconductor layer including a nitride semiconductor, the p-type semiconductor layer including a first p-side layer of $Al_{x1}Ga_{1-x1}N$ (0≤x1<1) including Mg, the second p-side layer of $Al_{x2}Ga_{1-x2}N$ (0<x2<1) including Mg provided between the first p-side layer and the n-type semiconductor layer, and a third p-side layer of $Al_{x3}Ga_{1-x3}N$ (x2<x3<1) including Mg provided between the first p-side layer and the second p-side layer, the light emitting layer including a plurality of barrier layers and a plurality of well layers provided respectively between the plurality of barrier layers, the method comprising:

forming the light emitting layer on the n-type semiconductor layer; and forming the p-type semiconductor layer on the light emitting layer, the forming of the light emitting layer including making a p-side barrier layer of the plurality of barrier layers most proximal to the second p-side layer to include a first layer of $Al_{z1}Ga_{1-z1}N$ (0≤z1) and a second layer of $Al_{z2}Ga_{1-z2}N$ (z1<z2<x2), the first layer being provided between the n-type semiconductor layer and the second p-side layer, the second layer being provided between the first layer and the second p-side layer to contact the first layer and the second p-side layer, a thickness of the p-side barrier layer being less than 3.5 nanometers, wherein a thickness of a p-side well layer of the plurality of well layers most proximal to the second p-side layer is thicker than a thickness of the one other well layer of the plurality of well layers.

\* \* \* \* \*